United States Patent
Shinohara

(10) Patent No.: US 10,655,208 B2
(45) Date of Patent: May 19, 2020

(54) SLIDING MEMBER AND PISTON RING

(71) Applicant: KABUSHIKI KAISHA RIKEN, Chiyoda-ku, Tokyo (JP)

(72) Inventor: Akio Shinohara, Tokyo (JP)

(73) Assignee: KABUSHIKI KAISHA RIKEN, Chiyoda-ku, Tokyo (JP)

( * ) Notice: Subject to any disclaimer, the term of this patent is extended or adjusted under 35 U.S.C. 154(b) by 0 days.

(21) Appl. No.: 15/758,447

(22) PCT Filed: Aug. 15, 2016

(86) PCT No.: PCT/JP2016/003742
§ 371 (c)(1),
(2) Date: Mar. 8, 2018

(87) PCT Pub. No.: WO2017/043022
PCT Pub. Date: Mar. 16, 2017

(65) Prior Publication Data
US 2018/0245200 A1 Aug. 30, 2018

(30) Foreign Application Priority Data
Sep. 9, 2015 (JP) ................................. 2015-177758

(51) Int. Cl.
*F16J 9/26* (2006.01)
*C23C 14/06* (2006.01)
(Continued)

(52) U.S. Cl.
CPC ........ *C23C 14/0605* (2013.01); *C23C 14/025* (2013.01); *C23C 28/32* (2013.01);
(Continued)

(58) Field of Classification Search
CPC ....................................................... F16J 9/26
See application file for complete search history.

(56) References Cited

U.S. PATENT DOCUMENTS

2012/0248711 A1* 10/2012 Iwashita ............. C23C 14/0605
277/444
2013/0004756 A1* 1/2013 Kennedy ............. C23C 14/0605
428/216
(Continued)

FOREIGN PATENT DOCUMENTS

JP 2002322555 A 11/2002
JP 2007169698 A 7/2007
(Continued)

OTHER PUBLICATIONS

Sep. 20, 2016, International Search Report issued in the International Patent Application No. PCT/JP2016/003742.
(Continued)

*Primary Examiner* — Kristina R Fulton
*Assistant Examiner* — L. Susmitha Koneru
(74) *Attorney, Agent, or Firm* — Kenja IP Law PC

(57) ABSTRACT

The provided sliding member has both excellent wear resistance and excellent coating adhesion even under harsh sliding conditions. The disclosed sliding member (100) is used in the presence of a lubricating oil and includes a base member (10), a metal intermediate layer (12) formed on the sliding surface (10A) side of the base member, a layered carbon coating (18) formed on the metal intermediate layer and having a first carbon coating (14) and a second carbon coating (16) layered alternately therein, and a hard carbon coating (20) formed on the layered carbon coating. Under bright-field observation with a transmission electron microscope, an image of the first carbon coating (14) is brighter than an image of the second carbon coating (16). Furthermore, 10 nm<T2≤1000 nm and 0.010≤T1/T2≤0.60, where T1 and T2 are the thicknesses of the first and second carbon coatings (14, 16).

6 Claims, 1 Drawing Sheet

(51) Int. Cl.
    *F16C 33/24*     (2006.01)
    *F16C 33/10*     (2006.01)
    *F16C 33/12*     (2006.01)
    *C23C 28/00*     (2006.01)
    *C23C 14/02*     (2006.01)
    *F16C 33/04*     (2006.01)

(52) U.S. Cl.
    CPC ............ *C23C 28/343* (2013.01); *C23C 28/44* (2013.01); *F16C 33/043* (2013.01); *F16C 33/10* (2013.01); *F16C 33/125* (2013.01); *F16C 33/24* (2013.01); *F16J 9/26* (2013.01); *F16C 33/1025* (2013.01); *F16C 2206/04* (2013.01); *F16C 2223/60* (2013.01)

(56) References Cited

U.S. PATENT DOCUMENTS

2015/0308573 A1\* 10/2015 Sato .......................... F02F 5/00
                                                          277/443

2016/0238132 A1\* 8/2016 Sato .......................... F16J 9/26

FOREIGN PATENT DOCUMENTS

| JP | 2008001951 | A | | 1/2008 | |
|---|---|---|---|---|---|
| JP | 2012202522 | A | \* | 10/2012 | ......... C23C 14/0605 |
| JP | 2012202522 | A | | 10/2012 | |
| JP | 2013194273 | A | | 9/2013 | |
| JP | 2015083875 | A | | 4/2015 | |

OTHER PUBLICATIONS

Jan. 9, 2018, Notification of Reasons for Refusal issued by the Japan Patent Office in the corresponding Japanese Patent Application No. 2015-177758.

Mar. 13, 2018, International Preliminary Report on Patentability issued in the International Patent Application No. PCT/JP2016/003742.

\* cited by examiner

SLIDING MEMBER AND PISTON RING

TECHNICAL FIELD

The present disclosure relates to a sliding member, in particular to a sliding member required to be highly reliable, such as an automotive part.

BACKGROUND

The sliding surface of a sliding member is typically coated by a hard carbon coating to increase the wear resistance. An amorphous carbon known as diamond-like carbon (DLC) is used as the carbon coating. Structurally, DLC is in essence a combination of diamond bonding (SP3 bonding) and graphite bonding (SP2 bonding) as the carbon bonding. Consequently, DLC has diamond-like hardness, wear resistance, thermal conductivity, and chemical stability while also having graphite-like solid lubricity. DLC is therefore suitable for use as a protective coating of a sliding member, such as an automotive part.

Since a hard carbon coating has high internal stress and extremely high hardness, however, the high carbon coating does not adhere closely to the base member when formed thickly and tends to peel. To address this problem, known techniques such as those in patent literature (PTL) 1 to 3 form a layered carbon coating on a sliding surface by alternately layering a high-hardness carbon coating and a low-hardness carbon coating. With these techniques, the stress of the layered carbon coating as a whole is alleviated by the low-hardness carbon coating, thereby achieving close adhesion of the layered carbon coating to the base member.

PTL 1 discloses a DLC multi-layer coating in which a low-density carbon coating with a density of 2.2 g/cm$^3$ or less and a high-density carbon coating with a density of 2.3 g/cm$^3$ to 3.2 g/cm$^3$ are layered alternately, the thickness T1 of the low-density carbon coating is 0.4 nm to 30 nm, the thickness T2 of the high-density carbon layer is 0.4 nm to 10 nm, and T1/T2 is 0.2 to 5.

PTL 2 discloses a piston ring in which the sliding surface is coated by a carbon-based coating. The coating is a layered coating with two or more layers, the layers being of two types with a different hardness. The hardness difference between the two types of layers is 500 HV to 1700 HV, the high-hardness layer has a thickness equal to or greater than the thickness of the low-hardness layer, and the thickness of the coating as a whole is 5.0 μm or more.

PTL 3 discloses a diamond-like carbon coating formed on a substrate with a bonding layer therebetween. A highly tough diamond-like carbon coating layer is formed to have four or more layers by alternately layering, on the upper layer of the bonding layer, a soft carbon coating that has a hardness of 500 Hv to 2000 Hv and is substantially free of hydrogen and a hard carbon coating that has a hardness of 2000 Hv to 4000 Hv and is substantially free of hydrogen. A lubricating diamond-like carbon coating layer with a hardness of 500 Hv to 2000 Hv and including hydrogen is then formed on the top layer, i.e. on the upper layer of the highly tough diamond-like carbon coating layer.

CITATION LIST

Patent Literature

PTL 1: JP 2002-322555 A
PTL 2: JP 2012-202522 A
PTL 3: JP 2008-1951 A

SUMMARY

Technical Problem

Each of the techniques in PTL 1 to 3 achieves wear resistance of the layered carbon coating as a whole by the high-hardness (high-density) carbon coating, i.e. achieves durability of the sliding member. These techniques also alleviate the stress of the layered carbon coating as a whole by the low-hardness (low-density) carbon coating, thereby achieving close adhesion of the layered carbon coating to the base member. However, a piston ring for a downsized turbo engine with improved fuel efficiency for environmental protection, for example, is used in an extremely harsh sliding environment with high temperatures and high surface pressure. Demand has therefore increased for sliding members to have both wear resistance and coating adhesion under the aforementioned harsh sliding conditions. The techniques in PTL 1 to 3, however, do not make wear resistance and coating adhesion sufficiently compatible under the aforementioned harsh sliding conditions.

In light of this problem, it is an aim of the present disclosure to provide a sliding member and a piston ring with both excellent wear resistance and excellent coating adhesion even under harsh sliding conditions.

Solution to Problem

We thoroughly investigated how to achieve this aim and discovered that in order to make wear resistance and coating adhesion compatible even under the aforementioned harsh sliding conditions, it is necessary to make the thickness of the low-hardness carbon coating smaller than the thickness of the high-hardness carbon coating in the layered carbon coating and moreover to set the thickness ratio thereof to fall within a specific range. By contrast, PTL 1 merely discloses that the thickness ratio T1/T2 is 0.2 to 5. Hence, so long as the high-hardness carbon coating and the low-hardness carbon coating are layered, either one may be thicker with this technique. PTL 2 also only discloses that the thickness of the low-hardness carbon coating is less than the thickness of the high-hardness carbon coating. PTL 3 is silent regarding the thickness ratio. The present disclosure was completed on the basis of the new technical idea of optimizing the thickness of the low-hardness carbon coating and the high-hardness carbon coating to achieve the aim of making wear resistance and coating adhesion compatible even under harsh sliding conditions, an aim not achievable with PTL 1 to 3.

Specifically, the primary features of the present disclosure are as follows.

(1) A sliding member used in the presence of a lubricating oil, the sliding member comprising:
 a base member;
 a metal intermediate layer formed on a sliding surface side of the base member;
 a layered carbon coating formed on the metal intermediate layer and having a first carbon coating and a second carbon coating layered alternately therein; and
 a hard carbon coating formed on the layered carbon coating;
 wherein under bright-field observation with a transmission electron microscope, an image of the first carbon coating is brighter than an image of the second carbon coating; and wherein T2 is more than 10 nm and 1000 nm or less, and T1/T2 is 0.010 or more and 0.60 or less, where T1 is a thickness of the first carbon coating, and T2 is a thickness of the second carbon coating.

(2) The sliding member of (1), comprising a thin metal coating having a thickness of 100 nm or less between the first carbon coating and the second carbon coating that are adjacent in the layered carbon coating.

(3) The sliding member of (1) or (2), wherein T3 is 3 μm or more and 20 μm or less, and T3/T4 is 2 or more and 20 or less, where T3 is a thickness of the layered carbon coating, and T4 is a thickness of the hard carbon coating.

(4) The sliding member of any one of (1) to (3), wherein the first carbon coating, the second carbon coating, and the hard carbon coating are substantially free of hydrogen.

(5) The sliding member of any one of (1) to (4), wherein the Martens hardness of the hard carbon coating is 6 GPa or more and 30 GPa or less.

(6) The sliding member of any one of (1) to (5), wherein the metal intermediate layer comprises one or more elements, or a carbide thereof, selected from the group consisting of Cr, Ti, Co, V, Mo, Si, and W, and a thickness of the metal intermediate layer is 0.1 μm or more and 0.6 μm or less.

(7) A piston ring comprising the sliding member of any one of (1) to (6), wherein an outer circumferential surface of the piston ring is the sliding surface.

Advantageous Effect

The sliding member and piston ring of the present disclosure have both excellent wear resistance and excellent coating adhesion even under harsh sliding conditions.

DETAILED DESCRIPTION (Sliding Member)

Figure 1:
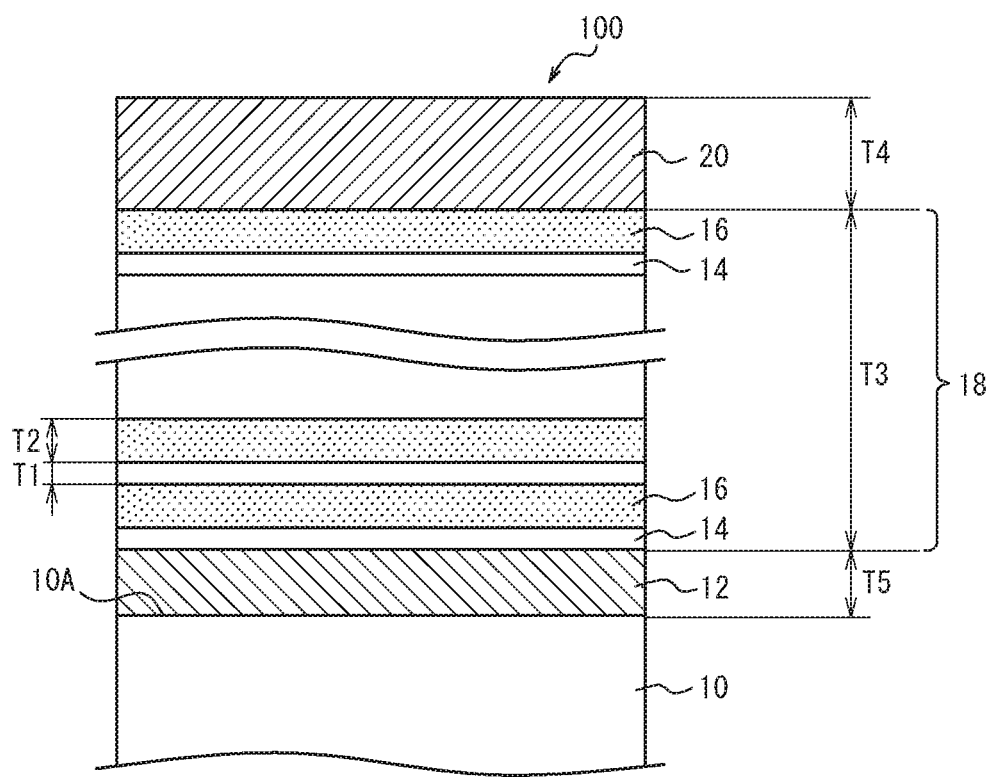
FIG. 1 is a schematic cross-section of the sliding member 100 according to an embodiment of the present disclosure.

As illustrated in FIG. 1, a sliding member 100 according to an embodiment of the present disclosure is used in the presence of a lubricating oil and includes a base member 10, a metal intermediate layer 12 formed on a sliding surface 10A side of the base member, a layered carbon coating 18 formed on the metal intermediate layer, a first carbon coating 14 and a second carbon coating 16 being layered alternately in the layered carbon coating 18, and a hard carbon coating 20 formed on the layered carbon coating. The layered carbon coating 18 and the hard carbon coating 20 are together referred to below as a "carbon coating".

(Base Member)

The base member 10 may be any material having the necessary strength to act as the base member of a sliding member. When the sliding member 100 of the present embodiment is used as a piston ring, preferable examples of the material of the base member 10 include steel, martensitic stainless steel, austenitic stainless steel, and high-grade cast iron. When the sliding member 100 is used as a seal ring in a CVT or the like, examples of the material of the base member 10 include resin. When the sliding member 100 is used as a vane or the like of a compressor, examples of the material of the base member 10 include an aluminum alloy.

(Metal Intermediate Layer)

By being formed between the base member 10 and the layered carbon coating 18, the metal intermediate layer 12 functions to alleviate the stress at the interface with the base member 10 and to improve the close adhesion of the layered carbon coating 18. To better achieve these functions, the metal intermediate layer 12 preferably comprises one or more elements, or a carbide thereof, selected from the group consisting of Cr, Ti, Co, V, Mo, Si, and W. The thickness of the metal intermediate layer 12 is preferably 0.1 μm or more and 0.6 μm or less, more preferably 0.2 μm or more and 0.5 μm or less. If the thickness is less than 0.1 μm, the function of increasing the close adhesion of the layered carbon coating 18 might not be sufficiently achieved, whereas if the thickness exceeds 0.6 μm, the metal intermediate layer 12 tends to undergo plastic flow during sliding, and the layered carbon coating 18 tends to peel.

Examples of methods for forming the metal intermediate layer 12 include sputtering. The metal intermediate layer 12 is formed as a film by placing the cleaned substrate 10 in the vacuum chamber of a PVD film formation apparatus and performing sputter discharge of a metal target in a state in which Ar gas is introduced. The metal target may be selected from among Cr, Ti, Co, V, Mo, Si, and W. The thickness of the metal intermediate layer 12 can be adjusted by the discharge time of the metal target.

(Layered Carbon Coating)

The layered carbon coating 18 is formed by alternately layering the first carbon coating 14 and the second carbon coating 16. The first carbon coating 14 is a low-hardness (low-density) carbon coating and has the functions of alleviating stress in the layered carbon coating 18 as a whole and of achieving close adhesion of the layered carbon coating 18 to the base member 10. The second carbon coating 16 is a high-hardness (high intensity) carbon coating and has the function of achieving wear resistance of the layered carbon coating 18 as a whole, i.e. durability of the sliding member.

The aforementioned difference in hardness and density of the first carbon coating 14 and the second carbon coating 16 can be identified by the difference in brightness of an image under bright-field observation with a transmission electron microscope (TEM image). Since the transmitted electron dose increases as the density is lower, the TEM image of materials with identical composition becomes brighter and whiter as the material density is lower. Therefore, in the present embodiment, the TEM image of the first carbon coating 14 is brighter than the TEM image of the second carbon coating 16.

The actual hardness and density of the first carbon coating 14 and second carbon coating 16 can be measured by forming these as single layers and then measuring with a micro indentation hardness tester, measuring with the glancing incidence X-ray analysis (GIXA) method, or measuring with the grazing incidence x-ray reflectometry (GIXR) method. When using this approach, the Martens hardness of the first carbon coating 14 is preferably 5 GPa to 13 GPa, and the Martens hardness of the second carbon coating 16 is preferably 13 GPa to 26 GPa. The density of the second carbon coating 16 is higher than the density of the first carbon coating 14.

A thin metal coating having a thickness of 100 nm or less is preferably included between the first carbon coating 14 and the second carbon coating 16 that are adjacent in the layered carbon coating 18. This thin metal layer has the function of increasing the close adhesion between the first carbon coating 14 and the second carbon coating 16 and of further improving the durability of the sliding member. In the thin metal layer, one or more elements, or a carbide thereof, selected from the group consisting of Cr, Ti, Co, V, Mo, Si, and W can be used, as in the metal intermediate layer 12. The element or elements forming the metal intermediate layer 12 are preferably used. The thickness of the thin metal coating is more preferably 50 nm or less.

The first carbon coating 14 and the second carbon coating 16 substantially consist of amorphous carbon (DLC). These coatings can be confirmed to be amorphous carbon by Raman spectrometry using a Raman spectrophotometer (Ar laser). The first carbon coating 14 and the second carbon coating 16 are preferably substantially free of hydrogen. In the present disclosure, "substantially free of hydrogen" means that the hydrogen content in the coating is 10 atm % or less by hydrogen forward scattering (HFS) analysis, with the balance substantially consisting of carbon. The hydrogen content is preferably 5 atm % or less.

The first carbon coating 14 and the second carbon coating 16 can, for example, be formed using a PVD method, such as ion plating. A PVD method allows formation of an amorphous carbon coating that is nearly free of hydrogen and has high hardness and excellent wear resistance.

When the first carbon coating 14 is formed using the ion plating method by vacuum arc discharge with a carbon target, the bias voltage applied to the base member is set to be high. The kinetic energy of carbon ions colliding with the base member increases when the setting of the bias voltage increases, causing the carbon to spatter and bounce off the base member surface, without being deposited on the base member surface. The first carbon coating is therefore formed as an amorphous, course structure with a consequently low density. Furthermore, the base member temperature rises due to irradiation with high-energy carbon ions when the setting of the bias voltage increases, thereby alleviating the residual stress in the first carbon coating and improving the close adhesion with the base member. After forming the first carbon coating 14, the second carbon coating 16 with a high coating density can be formed by setting the bias voltage applied to the base member to be low.

In the present embodiment, it is crucial that T2 be more than 10 nm and 1000 nm or less, and that T1/T2 be 0.010 or more and 0.60 or less, where T1 is the thickness of the first carbon coating 14, and T2 is the thickness of the second carbon coating 16. With regard to T2, if T2 is 10 nm or less, the hard second carbon coating 16 becomes too thin, preventing sufficient wear resistance under harsh sliding conditions from being achieved. If T2 exceeds 1000 nm, the hard second carbon coating 16 becomes too thick, and the layered carbon coating 18 tends to peel under harsh sliding conditions, preventing sufficient coating adhesion from being achieved. T2 is preferably 100 nm or more and 600 nm or less.

Furthermore, even when setting T2 within the aforementioned range, if T1/T2 is less than 0.010, the soft first carbon coating 14 is too thin relative to the hard second carbon coating 16. Consequently, the layered carbon coating 18 tends to peel under harsh sliding conditions, preventing sufficient coating adhesion from being achieved. If T1/T2 exceeds 0.60, the soft first carbon coating 14 is too thick relative to the hard second carbon coating 16. Consequently, sufficient wear resistance under harsh sliding conditions cannot be achieved. T1/T2 is preferably 0.010 or more and 0.4 or less.

The thickness T3 of the layered carbon coating 18 as a whole is preferably 3 μm or more and 20 μm or less, more preferably 5 μm or more and 15 μm or less. If T3 is less than 3 μm, the effect of alleviating stress of the layered carbon coating 18 as a whole becomes insufficient, and the close adhesion of the layered carbon coating 18 to the base member 10 might not be sufficiently achieved. If T3 exceeds 20 μm, the wear resistance of the layered carbon coating 18 as a whole, i.e. the durability of the sliding member, might not be sufficiently achieved.

The thickness T1 of the first carbon coating 14 and the thickness T2 of the second carbon coating 16 can respectively be adjusted by the bias application time of high voltage and low voltage. The thickness T3 of the layered carbon coating 18 can be adjusted by the number of layers of the first and second carbon coatings and by the arc discharge time of the carbon cathode.

The position (i.e. the bottom layer) of the layered carbon coating 18 that contacts the metal intermediate layer 12 may be either the first carbon coating 14 or the second carbon coating 16 but is preferably the first carbon coating 14. The position (i.e. the top layer) of the layered carbon coating 18 that contacts the hard carbon coating 20 may be either the first carbon coating 14 or the second carbon coating 16 but is preferably the second carbon coating 16.

(Hard Carbon Coating)

As the top layer on the sliding surface of the sliding member, the hard carbon coating 20 has the function of achieving wear resistance of the carbon coating, i.e. durability of the sliding member. The hard carbon coating 20 substantially consists of amorphous carbon (DLC). Like the first carbon coating 14 and the second carbon coating 16, the hard carbon coating 20 is preferably substantially free of hydrogen.

The Martens hardness of the hard carbon coating 20 is preferably 6 GPa or more and 30 GPa or less. If the Martens hardness is less than 6 GPa, the durability of the sliding member might not be sufficiently achieved, whereas if the Martens hardness exceeds 30 GPa, defects (chipping) or peeling may tend to occur in the hard carbon coating.

The thickness T4 of the hard carbon coating 20 is preferably set so that T3/T4 is 2 or more and 20 or less and more preferably 5 or more and 15 or less. By setting T3/T4 to be 2 or more, the close adhesion of the carbon coating can be further increased, and by setting T3/T4 to be 20 or less, the wear resistance of the carbon coating, i.e. the durability of the sliding member, can be increased.

Like the layered carbon coating 18, the hard carbon coating 20 can, for example, be formed using a PVD method, such as ion plating. When the hard carbon coating 20 is formed using the ion plating method by vacuum arc discharge with a carbon target, the hardness thereof can be adjusted by the bias voltage applied to the base member.

(Piston Ring)

Figure 2:
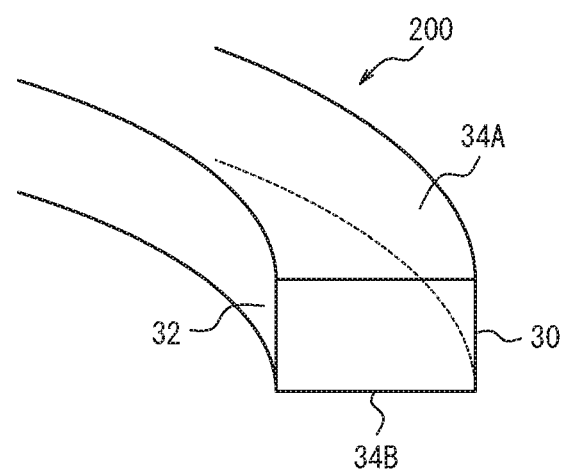
FIG. 2 is a cross-sectional perspective view of a piston ring 200 according to an embodiment of the present disclosure.

A piston ring 200, illustrated in FIG. 2, according to an embodiment of the present disclosure comprises the aforementioned sliding member 100, and an outer circumferential surface 30 thereof has the layered structure of the carbon coating illustrated in FIG. 1. The outer circumferential surface 30 that becomes the sliding surface therefore has both excellent wear resistance and excellent coating adhesion even under harsh sliding conditions. The inner circumferential surface 32 and the upper and lower surfaces 34A and 34B of the piston ring need not have the layered structure of the carbon coating illustrated in FIG. 1.

The sliding member 100 according to an embodiment of the present disclosure can be applied to a variety of products other than a piston ring, such as a valve lifter, a vane, a rocker arm, or a seal ring.

EXAMPLES

Under the following conditions, the metal intermediate layer and the carbon coating (layered carbon coating, hard carbon coating) listed in Table 1 and Table 2 were formed on the outer circumferential surface of a piston ring.

The metal intermediate layer was formed by subjecting a piston ring body (base member) to ultrasonic cleaning with acetone and isopropyl alcohol, subsequently placing the piston ring body in the vacuum chamber of a PVD film formation apparatus, and performing sputter discharge of a metal target in a state in which Ar gas is introduced. The type of metal target was selected from among Cr, Ti, and W. The thickness of the metal intermediate layer was adjusted by the discharge time of the metal target.

After formation of the metal intermediate layer, a layered carbon coating was then formed in the same chamber. The layered carbon coating was formed by vacuum arc discharge of a carbon target, and a structure in which a low-density carbon layer and a high-density carbon layer were layered alternately was obtained by alternating the bias voltage applied to the piston ring during discharge between a high voltage and a low voltage.

After formation of the layered carbon coating, a hard carbon coating was then formed in the same chamber. The hard carbon coating was formed by vacuum arc discharge of a carbon target, like the layered carbon coating. The hardness was adjusted by the bias voltage applied to the piston ring body during coating formation.

(Measurement of Coating Thickness)

A cross-section of the layered carbon coating was subjected to bright-field observation with a TEM. The low-density carbon coating appeared bright, and the high-density carbon coating appeared dark. The measured values of the coatings in the cross-sectional TEM images were taken as T1 and T2. Similarly, the thickness T3 of the layered carbon coating and the thickness T4 of the hard carbon coating were calculated by bright-field observation with a TEM.

(Measurement of Hard Carbon Coating Hardness)

The Martens hardness of the hard carbon layer was measured using a super-micro indentation hardness tester produced by ELIONIX Inc. The hardness was tested under the conditions of using a Berkovich indenter with a load such that the indentation depth was approximately 1/10 of the coating thickness of the hard carbon layer.

(Evaluation Test)

Coating adhesion (anti-peeling property) and wear resistance (durability) were evaluated as follows by a reciprocating sliding test using piston ring pieces according to the Examples and Comparative Examples and an opposing material constituted by an SUJ2 material (JIS G 4805).

(Method for Evaluating Coating Adhesion)

After applying 0W-20 engine oil to the opposing material and heating to 80° C., a load of 300 N was applied to the piston ring piece, and the piston ring piece was pressed against the opposing material and slid back and forth for one hour at a speed of 50 Hz. The close adhesion of the carbon coating was judged on the basis of the state of the piston ring sliding mark after the test. The results are listed in Tables 1 and 2.

Evaluation Criteria

Excellent (E): In all five evaluation tests, no peeling of the carbon coating whatsoever occurred.

Good (G): Out of five evaluation tests, peeling of the carbon coating was not observed in three or more tests, and slight peeling of the carbon coating was observed in two or fewer tests.

Poor (P): Out of five evaluation tests, peeling of the carbon coating was observed in three or more tests.

(Method for Evaluating Wear Resistance)

After applying 0W-20 engine oil to the opposing material and heating to 80° C., a load of 50 N was applied to the piston ring piece, and the piston ring piece was pressed against the opposing material and slid back and forth for six hours at a speed of 50 Hz. The amount of wear (depth of wear) of the carbon coating was calculated on the basis of the shape of the piston ring sliding mark after the test. The results are listed in Tables 1 and 2 as indices, with the amount of wear for Sample No. 22 being 1.

TABLE 1

| | | Metal intermediate layer | | Layered carbon coating | | | | Hard carbon coating | | | | |
|---|---|---|---|---|---|---|---|---|---|---|---|---|
| No. | Classification | Element | Thickness (μm) | Thickness T1 (nm) | Thickness T2 (nm) | T1/T2 | Thickness T3 (μm) | Thickness T4 (μm) | T3/T4 | Martens hardness (GPa) | Coating adhesion | Wear resistance |
| 1 | Example | Cr | 0.3 | 1 | 11 | 0.091 | 10.2 | 1.5 | 6.80 | 23.6 | E | 0.79 |
| 2 | Example | Cr | 0.3 | 4 | 12 | 0.333 | 10.2 | 1.5 | 6.80 | 23.3 | E | 0.83 |
| 3 | Example | Cr | 0.3 | 6 | 11 | 0.545 | 10.1 | 1.6 | 6.31 | 23.9 | E | 0.86 |
| 4 | Comparative Example | Cr | 0.3 | 7 | 11 | 0.636 | 10.2 | 1.5 | 6.80 | 23.5 | E | 0.99 |
| 5 | Example | Cr | 0.3 | 1 | 61 | 0.016 | 10.2 | 1.5 | 6.80 | 23.6 | E | 0.65 |
| 6 | Example | Cr | 0.3 | 21 | 62 | 0.339 | 10.2 | 1.5 | 6.80 | 23.3 | E | 0.67 |
| 7 | Example | Cr | 0.3 | 35 | 61 | 0.574 | 10.1 | 1.6 | 6.31 | 23.9 | E | 0.72 |
| 8 | Comparative Example | Cr | 0.3 | 38 | 61 | 0.623 | 10.2 | 1.5 | 6.80 | 23.7 | E | 0.97 |
| 9 | Comparative Example | Cr | 0.3 | 1 | 120 | 0.008 | 10.3 | 1.5 | 6.87 | 23.6 | P | peeled |
| 10 | Comparative Example | Cr | 0.3 | 1 | 506 | 0.002 | 10.2 | 1.5 | 6.80 | 23.3 | P | peeled |
| 11 | Example | Cr | 0.3 | 6 | 505 | 0.012 | 10.2 | 1.6 | 6.38 | 24.1 | E | 0.56 |
| 12 | Example | Cr | 0.3 | 175 | 502 | 0.349 | 10.3 | 1.5 | 6.87 | 22.9 | E | 0.51 |

TABLE 1-continued

| No. | Classification | Metal intermediate layer Element | Thickness (μm) | Layered carbon coating Thickness T1 (nm) | Thickness T2 (nm) | T1/T2 | Thickness T3 (μm) | Hard carbon coating Thickness T4 (μm) | T3/T4 | Martens hardness (GPa) | Coating adhesion | Wear resistance |
|---|---|---|---|---|---|---|---|---|---|---|---|---|
| 13 | Example | Cr | 0.3 | 302 | 510 | 0.592 | 10.2 | 1.6 | 6.38 | 23.3 | E | 0.74 |
| 14 | Comparative Example | Cr | 0.3 | 320 | 510 | 0.627 | 10.1 | 1.5 | 6.73 | 23.5 | E | 0.95 |
| 15 | Comparative Example | Cr | 0.3 | 7 | 994 | 0.007 | 10.1 | 1.5 | 6.73 | 23.6 | P | peeled |
| 16 | Example | Cr | 0.3 | 11 | 980 | 0.011 | 10.2 | 1.5 | 6.80 | 23.9 | E | 0.72 |
| 17 | Example | Cr | 0.3 | 302 | 982 | 0.308 | 10.1 | 1.5 | 6.73 | 23.6 | E | 0.71 |
| 18 | Example | Cr | 0.3 | 582 | 997 | 0.584 | 10.1 | 1.6 | 6.31 | 23.6 | E | 0.75 |
| 19 | Comparative Example | Cr | 0.3 | 625 | 997 | 0.627 | 10.2 | 1.5 | 6.80 | 23.5 | E | 0.94 |
| 20 | Comparative Example | Cr | 0.3 | 1 | 8 | 0.125 | 10.2 | 1.6 | 6.38 | 23.9 | E | 0.93 |
| 21 | Comparative Example | Cr | 0.3 | 310 | 1120 | 0.277 | 10.2 | 1.5 | 6.80 | 23.6 | P | peeled |
| 22 | Comparative Example | Cr | 0.3 | 502 | 489 | 1.027 | 10.4 | 0.8 | 13.00 | 22.6 | G | 1 |

TABLE 2

| No. | Classification | Metal intermediate layer Element | Thickness (μm) | Layered carbon coating Thickness T1 (nm) | Thickness T2 (nm) | T1/T2 | Thickness T3 (μm) | Hard carbon coating Thickness T4 (μm) | T3/T4 | Martens hardness (GPa) | Coating adhesion | Wear resistance |
|---|---|---|---|---|---|---|---|---|---|---|---|---|
| 23 | Example | Cr | 0.3 | 6 | 512 | 0.012 | 10.2 | 5.6 | 1.82 | 23.5 | G | 0.68 |
| 24 | Example | Cr | 0.3 | 5 | 501 | 0.010 | 3.1 | 1.5 | 2.07 | 24.3 | E | 0.68 |
| 25 | Example | Cr | 0.3 | 6 | 510 | 0.012 | 10.2 | 4.8 | 2.13 | 22.9 | E | 0.62 |
| 26 | Example | Cr | 0.3 | 5 | 500 | 0.010 | 19.8 | 8.4 | 2.36 | 23.7 | E | 0.69 |
| 27 | Example | Cr | 0.3 | 6 | 511 | 0.012 | 22.4 | 0.8 | 28.00 | 21.2 | E | 0.88 |
| 28 | Example | Cr | 0.3 | 5 | 490 | 0.010 | 2.6 | 0.7 | 3.71 | 22.3 | G | 0.78 |
| 29 | Example | Cr | 0.3 | 6 | 500 | 0.012 | 21.5 | 1.5 | 14.33 | 21.2 | E | 0.85 |
| 30 | Example | Cr | 0.3 | 5 | 502 | 0.010 | 10.3 | 1.5 | 6.87 | 5.3 | E | 0.89 |
| 31 | Example | Cr | 0.3 | 6 | 518 | 0.012 | 10.2 | 1.5 | 6.80 | 6.2 | E | 0.79 |
| 32 | Example | Cr | 0.3 | 5 | 512 | 0.010 | 10.3 | 1.6 | 6.80 | 29.9 | E | 0.72 |
| 33 | Example | Cr | 0.3 | 6 | 507 | 0.012 | 10.2 | 1.5 | 6.80 | 31.2 | G | 0.88 |
| 34 | Example | Cr | 0.1 | 255 | 504 | 0.506 | 10.2 | 1.5 | 6.80 | 24.3 | E | 0.72 |
| 35 | Example | Cr | 0.3 | 252 | 514 | 0.490 | 10.1 | 1.6 | 6.31 | 24.0 | E | 0.63 |
| 36 | Example | Cr | 0.6 | 258 | 499 | 0.517 | 10.3 | 1.5 | 6.87 | 23.9 | E | 0.60 |
| 37 | Example | Ti | 0.3 | 260 | 497 | 0.523 | 10.2 | 1.6 | 6.38 | 24.5 | E | 0.74 |
| 38 | Example | W | 0.3 | 248 | 510 | 0.486 | 10.2 | 1.5 | 6.80 | 24.3 | E | 0.74 |
| 39 | Example | Cr | 0.05 | 252 | 504 | 0.500 | 10.2 | 1.5 | 6.80 | 23.6 | G | 0.85 |
| 40 | Example | Cr | 0.7 | 258 | 499 | 0.517 | 10.3 | 1.6 | 6.44 | 24.4 | G | 0.83 |
| 41 | Comparative Example | Cr | 0.05 | 1 | 510 | 0.002 | 10.1 | 1.5 | 6.73 | 24.3 | P | peeled |
| 42 | Comparative Example | Cr | 0.7 | 1 | 497 | 0.002 | 10.2 | 1.5 | 6.80 | 24.5 | P | peeled |

As is clear from Table 1 and Table 2, when T2 is in a range such that T2 exceeds 10 nm and is 1000 nm or less, then by setting T1/T2 to be 0.010 or more and 0.60 or less, wear resistance and coating adhesion are achieved even under the aforementioned harsh sliding conditions of a high temperature and high surface pressure. However, sufficient coating adhesion cannot be achieved when T1/T2 is less than 0.010, and sufficient wear resistance cannot be achieved when T1/T2 exceeds 0.60.

INDUSTRIAL APPLICABILITY

The sliding member of the present disclosure can be suitably applied to a piston ring that has a curved sliding surface and is for an internal combustion engine in which the contact surface pressure with the cylinder bore during initial sliding is high. The sliding member of the present disclosure has both excellent wear resistance and excellent coating adhesion even under harsh sliding conditions. Therefore, the sliding member can suitably be used particularly as a piston ring for a downsized turbo engine with improved fuel efficiency for environmental protection.

REFERENCE SIGNS LIST

100 Sliding member
10 Base member
10A Sliding surface
12 Metal intermediate layer
14 First carbon coating (low-hardness carbon coating)
16 Second carbon coating (high-hardness carbon coating)
18 Layered carbon coating
20 Hard carbon coating
200 Piston ring 30 Outer circumferential surface
32 Inner circumferential surface
34A, 34B Upper and lower surfaces (upper and lower sides)

The invention claimed is:

1. A sliding member used in the presence of a lubricating oil, the sliding member comprising:
   a base member;
   a metal intermediate layer formed on a sliding surface side of the base member;
   a layered carbon coating formed on the metal intermediate layer and having a first carbon coating and a second carbon coating layered alternately therein; and
   a hard carbon coating formed on the layered carbon coating, the hard carbon coating having a Martens hardness of 6 GPa or more and 30 GPa or less;
   wherein under bright-field observation with a transmission electron microscope, an image of the first carbon coating is brighter than an image of the second carbon coating;
   wherein T2 is more than 10 nm and 1000 nm or less, and T1/T2 is 0.010 or more and 0.60 or less, where T1 is a thickness of the first carbon coating, and T2 is a thickness of the second carbon coating, and wherein the hard carbon coating is in contact with the second carbon coating.

2. The sliding member of claim 1, comprising a thin metal coating having a thickness of 100 nm or less between the first carbon coating and the second carbon coating that are adjacent in the layered carbon coating.

3. The sliding member of claim 1, wherein T3 is 3 µm or more and 20 µm or less, and T3/T4 is 2 or more and 20 or less, where T3 is a thickness of the layered carbon coating, and T4 is a thickness of the hard carbon coating.

4. The sliding member of claim 1, wherein the first carbon coating, the second carbon coating, and the hard carbon coating are substantially free of hydrogen.

5. The sliding member of claim 1, wherein the metal intermediate layer comprises one or more elements, or a carbide thereof, selected from the group consisting of Cr, Ti, Co, V, Mo, Si, and W, and a thickness of the metal intermediate layer is 0.1 µm or more and 0.6 µm or less.

6. A piston ring comprising the sliding member of claim 1, wherein an outer circumferential surface of the piston ring is the sliding surface.

* * * * *